United States Patent
Guo et al.

(10) Patent No.: US 10,772,153 B2
(45) Date of Patent: Sep. 8, 2020

(54) METHODS AND APPARATUS FOR TWO-STAGE ACK/DTX DETECTION

(71) Applicant: Cavium, LLC, Santa Clara, CA (US)

(72) Inventors: Yuanbin Guo, Mountain House, CA (US); Hong Jik Kim, San Jose, CA (US)

(73) Assignee: CAVIUM, LLC., Santa Clara, CA (US)

( * ) Notice: Subject to any disclaimer, the term of this patent is extended or adjusted under 35 U.S.C. 154(b) by 0 days.

(21) Appl. No.: 16/384,878

(22) Filed: Apr. 15, 2019

(65) Prior Publication Data

US 2019/0335529 A1 Oct. 31, 2019

Related U.S. Application Data

(60) Provisional application No. 62/663,734, filed on Apr. 27, 2018.

(51) Int. Cl.
| | |
|---|---|
| *H04W 76/28* | (2018.01) |
| *H04L 5/00* | (2006.01) |
| *H04L 1/16* | (2006.01) |
| *H03K 19/23* | (2006.01) |
| *G06F 11/18* | (2006.01) |
| *H04L 1/00* | (2006.01) |

(52) U.S. Cl.
CPC .......... *H04W 76/28* (2018.02); *G06F 11/183* (2013.01); *H03K 19/23* (2013.01); *H04L 1/0057* (2013.01); *H04L 1/1607* (2013.01); *H04L 5/0055* (2013.01)

(58) Field of Classification Search
CPC ...... H04W 76/28; G06F 11/183; H03K 19/23; H04L 1/0057; H04L 1/1607; H04L 5/0055
See application file for complete search history.

(56) References Cited

U.S. PATENT DOCUMENTS

| | | | | |
|---|---|---|---|---|
| 2009/0219874 A1* | 9/2009 | Yokoyama | ............ | H04L 1/0015 370/329 |
| 2011/0280346 A1* | 11/2011 | Yang | ............... | H04L 1/1607 375/341 |
| 2012/0033561 A1* | 2/2012 | Kawamura | ........... | H04L 1/1628 370/252 |
| 2012/0087238 A1* | 4/2012 | Nakao | ................... | H04L 5/0053 370/225 |
| 2012/0092982 A1* | 4/2012 | Nakao | ................... | H04L 1/1621 370/216 |

(Continued)

OTHER PUBLICATIONS

Wen, W., et al., "Enhancing Performance of Random Caching in Large-Scale Heterogeneous Wireless Networks With Random Discontinuous Transmission", IEEE Transactions on Communications, vol. 66, Issue: 12, IEEE, Dec. 2018, pp. 6287-6303. (Year: 2018).*

(Continued)

*Primary Examiner* — Kyle Vallecillo
(74) *Attorney, Agent, or Firm* — JW Law Group; James M. Wu

(57) ABSTRACT

Methods and apparatus for two-stage ACK/DTX detection. In an embodiment, a method includes determining a first stage DTX value from bit-domain correlation values, and determining a second stage DTX value from symbol domain correlation values generated from candidate ACK bits. The method also includes determining a DTX decision based on the first stage DTX value and the second stage DTX value.

20 Claims, 7 Drawing Sheets

(56) References Cited

U.S. PATENT DOCUMENTS

| | | | | |
|---|---|---|---|---|
| 2012/0134333 A1* | 5/2012 | Nakao | ......... | H04W 72/042 |
| | | | | 370/329 |
| 2012/0182858 A1* | 7/2012 | Nakao | ......... | H04W 72/1284 |
| | | | | 370/216 |
| 2013/0021920 A1* | 1/2013 | Nakao | ......... | H04L 5/0053 |
| | | | | 370/242 |
| 2013/0064210 A1* | 3/2013 | Nakao | ......... | H04L 1/1861 |
| | | | | 370/329 |
| 2013/0286996 A1* | 10/2013 | Takeda | ......... | H04L 1/1692 |
| | | | | 370/329 |
| 2015/0237674 A1* | 8/2015 | Sandoi | ......... | H04W 76/28 |
| | | | | 370/252 |
| 2020/0106565 A1* | 4/2020 | Li | ......... | H04W 74/0808 |

OTHER PUBLICATIONS

"3GPP Technical Specification 36.211", 2013, V10.7.0, Valbonne, France, www.3gpp.org.

D. Wang, S. Yang, Y. Liao, Y. Liu, "Efficient Receiver Scheme for LTE PUCCH" in IEEE Communications Letter, Mar. 2012, 2012, vol. 16 No. 3.

Y. Wu, D. Danev, E. G. Larsson, "On ACK/NACK Messages Detection in the LTE PUCCH with Multiple Receive Antennas" in 20th European Signal Processing Conference, Aug. 27-31, 2012, Bucharest, Romania.

\* cited by examiner

METHODS AND APPARATUS FOR TWO-STAGE ACK/DTX DETECTION

CLAIM TO PRIORITY

This application claims the benefit under 35 U.S.C. § 119 of U.S. Provisional Application No. 62/663,734, filed on Apr. 27, 2018, and entitled "METHOD AND APPARATUS FOR TWO-STAGE ACK DTX DETECTION FOR CARRIER AGGRESSION WITH SYMBOL DOMAIN METRIC AND MAJORITY LOGIC DECISION," which is incorporated herein by reference in its entirety.

FIELD

The exemplary embodiment(s) of the present invention relates to telecommunications network. More specifically, the exemplary embodiment(s) of the present invention relates to receiving and processing data streams via a wireless communication network.

BACKGROUND

With a rapidly growing trend of mobile and remote data access over a high-speed communication network such as third generation (3G) or fourth generation (4G) cellular services, accurately delivering and deciphering data streams become increasingly challenging and difficult. The high-speed communication network which is capable of delivering information includes, but not limited to, wireless network, cellular network, wireless personal area network ("WPAN"), wireless local area network ("WLAN"), wireless metropolitan area network ("MAN"), or the like. While WPAN can be Bluetooth or ZigBee, WLAN may be a Wi-Fi network in accordance with IEEE 802.11 WLAN standards.

Typically, wireless network performance depends in part on the quality of the transmission channel. For example, if the channel conditions are good, the network may perform with higher speed and capacity than when the channel conditions are poor. To obtain the best network performance, wireless networks may rely on user devices (e.g., user equipment "UE") to report control information back to the network. The control information includes parameters indicating the channel conditions and/or transmission parameters.

In the Third Generation Partnership Project (3GPP) Long-Term Evolution (LTE) standard, a Physical Uplink Control Channel (PUCCH) carries important control information, such as HARQ-ACK bits or SR bits for carrier aggregation. The performance of ACK messages play an important role in the overall downlink performance as the residual error rate of HARQ is in the same order of the feedback error rate of ACK bits. For example, after a user device receives a transmission from a network server, it generates acknowledgement (ACK) bits that indicates whether or not the transmission was properly received. The ACK bits are transmitted back to the network server through the PUCCH. The server can determine from the received ACK bits whether the transmission was properly received, and initiate a retransmission if necessary.

Discontinuous transmission (DTX) is a method of momentarily powering-down, or muting, a mobile or portable wireless UE when there is no voice input to the send. This optimizes the overall efficiency of the wireless voice communications system. During DTX mode, no ACKs are transmitted. However, it is then up to the receiver to determine whether ACK/NACK symbols have been received from a UE, or if the UE is in DTX mode. Unfortunately, conventional DTX detection may lead to detection errors and corresponding transmission inefficiencies.

Therefore, it is desirable to have a mechanism that efficiently detects DTX operation to enhance network performance.

SUMMARY

The following summary illustrates a simplified version(s) of one or more aspects of present invention. The purpose of this summary is to present some concepts in a simplified description as more detailed description that will be presented later.

In various exemplary embodiments, methods and apparatus are provided for efficiently detecting DTX operation for UE in LTE PUCCH format 3 uplink communications using Reed-Muller decoders and symbol regeneration.

In an exemplary embodiment, a method is provided that comprises determining a first stage DTX value from bit-domain correlation values, determining a second stage DTX value from symbol domain correlation values, and determining a DTX decision based on the first stage DTX value and the second stage DTX value.

In an exemplary embodiment, an apparatus is provided that comprises bit-domain decision logic that determines a first stage DTX value from bit-domain correlation values, symbol domain decision logic that determines a second stage DTX value from symbol domain correlation values, and DTX decision logic that determines a DTX decision based on the first stage DTX value and the second stage DTX value.

Additional features and benefits of the exemplary embodiment(s) of the present invention will become apparent from the detailed description, figures and claims set forth below.

BRIEF DESCRIPTION OF THE DRAWINGS

The exemplary aspect(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
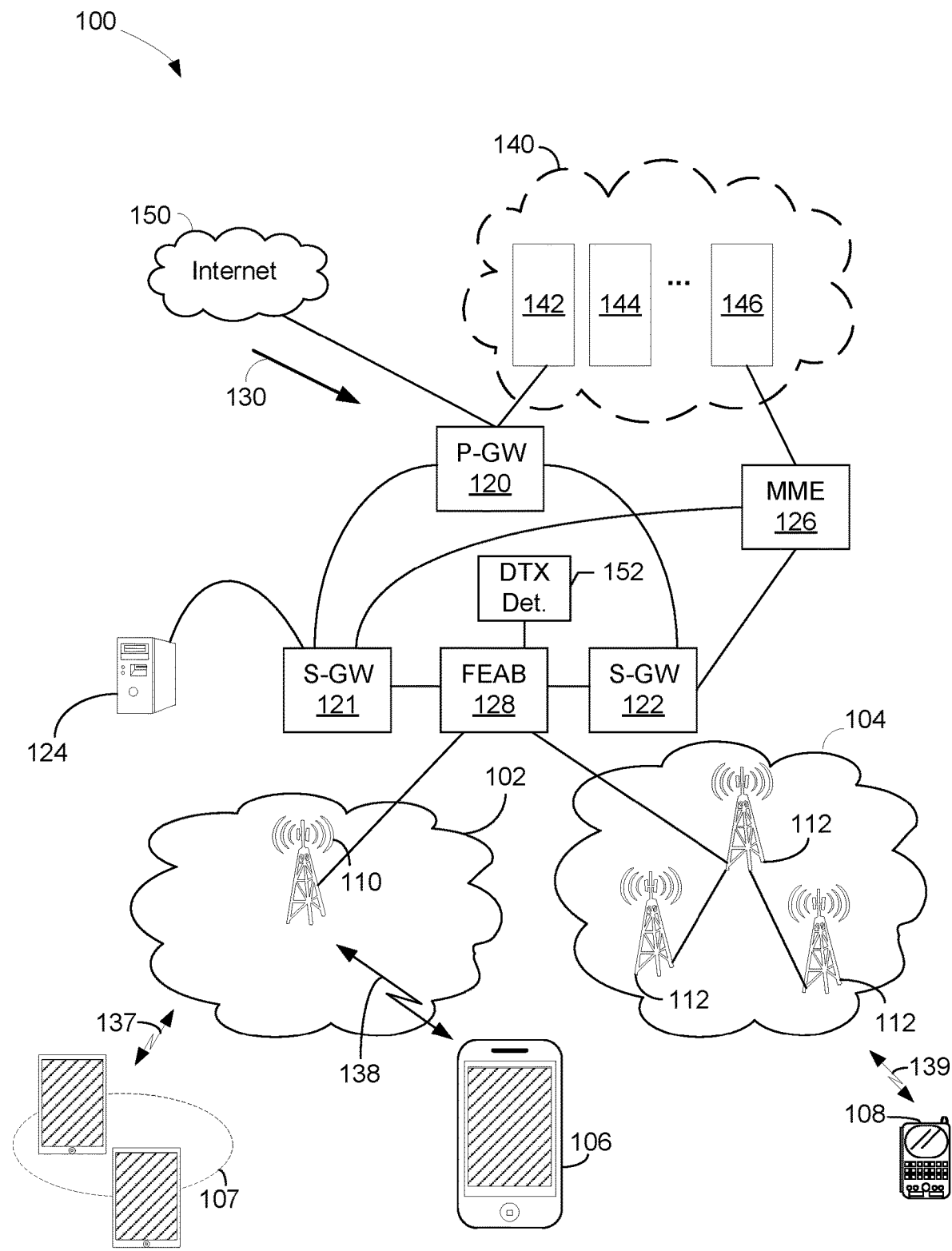
FIG. 1 is a block diagram illustrating a communication network configured to transmit and receive data streams using various embodiments of a DTX detector to detect discontinuous operation.

The purpose of the following detailed description is to provide an understanding of one or more embodiments of the present invention. Those of ordinary skills in the art will realize that the following detailed description is illustrative only and is not intended to be in any way limiting. Other embodiments will readily suggest themselves to such skilled persons having the benefit of this disclosure and/or description.

In the interest of clarity, not all of the routine features of the implementations described herein are shown and described. It will, of course, be understood that in the development of any such actual implementation, numerous implementation-specific decisions may be made in order to achieve the developer's specific goals, such as compliance with application- and business-related constraints, and that these specific goals will vary from one implementation to another and from one developer to another. Moreover, it will be understood that such a development effort might be complex and time-consuming but would nevertheless be a routine undertaking of engineering for those of ordinary skills in the art having the benefit of embodiment(s) of this disclosure.

Various embodiments of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method. The same reference indicators will be used throughout the drawings and the following detailed description to refer to the same or like parts.

The term "system" or "device" is used generically herein to describe any number of components, elements, subsystems, devices, packet switch elements, packet switches, access switches, routers, networks, modems, base stations, eNB (eNodeB), computer and/or communication devices or mechanisms, or combinations of components thereof. The term "computer" includes a processor, memory, and buses capable of executing instruction wherein the computer refers to one or a cluster of computers, personal computers, workstations, mainframes, or combinations of computers thereof.

IP communication network, IP network, or communication network means any type of network having an access network that is able to transmit data in a form of packets or cells, such as ATM (Asynchronous Transfer Mode) type, on a transport medium, for example, the TCP/IP or UDP/IP type. ATM cells are the result of decomposition (or segmentation) of packets of data, IP type, and those packets (here IP packets) comprise an IP header, a header specific to the transport medium (for example UDP or TCP) and payload data. The IP network may also include a satellite network, a DVB-RCS (Digital Video Broadcasting-Return Channel System) network, providing Internet access via satellite, or an SDMB (Satellite Digital Multimedia Broadcast) network, a terrestrial network, a cable (xDSL) network or a mobile or cellular network (GPRS/EDGE, or UMTS (where applicable of the MBMS (Multimedia Broadcast/Multicast Services) type, or the evolution of the UMTS known as LTE (Long Term Evolution), or DVB-H (Digital Video Broadcasting-Handhelds)), or a hybrid (satellite and terrestrial) network.

FIG. 1 is a block diagram illustrating a communication network 100 configured to transmit and receive data streams using various embodiments of a DTX detector 152 to detect discontinuous operation. The network 100 includes packet data network gateway ("P-GW") 120, two serving gateways ("S-GWs") 121-122, two base stations (or cell sites) 102-104, server 124, and Internet 150. P-GW 120 includes various components 140 such as billing module 142, subscribing module 144, tracking module 146, and the like to facilitate routing activities between sources and destinations. It should be noted that the underlying concept of the exemplary embodiment(s) of the present invention would not change if one or more blocks (or devices) were added to or removed from diagram 100.

The network configuration illustrated by the communication network 100 may also be referred to as a third generation ("3G"), 4G, LTE, 5G, or combination of 3G and 4G cellular network configuration. MME 126, in one aspect, is coupled to base stations (or cell site) and S-GWs capable of facilitating data transfer between 3G and LTE or between 2G and LTE. MME 126 performs various controlling/managing functions, network securities, and resource allocations.

In an embodiment, the S-GW 121 or 122, in one example, coupled to P-GW 120, MME 126, and base stations 102 or 104, is capable of routing data packets from base station 102, or eNodeB, to P-GW 120 and/or MME 126. A function of S-GW 121 or 122 is to perform an anchoring function for mobility between 3G and 4G equipment. S-GW 122 is also able to perform various network management functions, such as terminating paths, paging idle UEs, storing data, routing information, generating replica, and the like.

In an embodiment, the P-GW 120, coupled to S-GWs 121-122 and Internet 150, is able to provide network communication between user equipment ("UE") and IP based networks such as Internet 150. P-GW 120 is used for connectivity, packet filtering, inspection, data usage, billing, or PCRF (policy and charging rules function) enforcement, et cetera. P-GW 120 also provides an anchoring function for mobility between 3G and 4G (or LTE) packet core network(s).

Sectors or blocks 102-104 are coupled to a base station or FEAB 128, which may also be known as cell site, node B, or eNodeB. Sectors 102-104 include one or more radio towers 110 or 112. Radio tower 110 or 112 is further coupled to various UEs, such as a cellular phone 106, a handheld device 108, tablets and/or iPad® 107 via wireless communications or channels 137-139. Devices 106-108 can be portable devices or mobile devices, such as iPhone®, BlackBerry®, Android®, and so on. Base station 102 facilitates network communication between mobile devices such as UEs 106-107 with S-GW 121 via radio towers 110. It should be noted that base station or cell site can include additional radio towers as well as other land switching circuitry.

Server 124 is coupled to P-GW 120 and base stations 102-104 via S-GW 121 or 122. In one embodiment, server 124 which contains a soft decoding scheme 128 is able to distribute and/or manage soft decoding and/or hard decoding based on predefined user selections. In one exemplary instance, upon detecting a downstream push data 130 addressing to mobile device 106 which is located in a busy traffic area or noisy location, base station 102 can elect to decode the downstream using the soft decoding scheme distributed by server 124. One advantage of using the soft decoding scheme is that it provides more accurate data decoding, whereby overall data integrity may be enhanced.

When receiving bit-streams via one or more wireless or cellular channels, a decoder can optionally receive or decipher bit-streams with hard decision or soft decision. A hard decision is either 1 or 0 which means any analog value greater than 0.5 is a logic value one (1) and any analog value less than 0.5 is a logic value zero (0). Alternatively, a soft decision or soft information can provide a range of value from 0, 0.2, 0.4, 0.5, 0.6, 0.8, 0.9, and the like. For example, soft information of 0.8 would be deciphered as a highly likelihood one (1) whereas soft information of 0.4 would be interpreted as a weak zero (0) and maybe one (1).

A base station, in one aspect, includes one or more FEABs 128. For example, FEAB 128 can be a transceiver of a base station or eNodeB. In one aspect, mobile devices such tables or iPad® 107 uses a first type of RF signals to communicate with radio tower 110 at sector 102 and portable device 108 uses a second type of RF signals to communicate with radio tower 112 at sector 104. After receiving RF signals, FEAB 128 is able to process the received PUCCH transmissions using a DTX detector 152 that detects DTX operation of UE in LTE PUCCH format 3 uplink transmissions as described in greater detail below.

Table 1 illustrates PUCCH format 3 and specifies two coding scenarios depending on the number of ACK bits, $[N_{A/N}^{PUCCH\ format\ 3} \leq 11]$ using a single Reed Muller (RM) coding and $[11 < N_{A/N}^{PUCCH\ format\ 3} \leq 22]$ using interleaved dual RM coding.

TABLE 1

Features of PUCCH format 3.

| Format | Channel coding | Modln (Bits) |
|---|---|---|
| Format 3 $N_{A/N}^{PUCCH\ format\ 3} \leq 11$ | Reed Muller | QPSK |
| Format 3 $11 < N_{A/N}^{PUCCH\ format\ 3} \leq 22$ | Interleaved dual Reed Muller | QPSK |

For DTX detection, 3GPP specifies some major minimum performance requirements for ACK bits in format 3. The first performance requirement is the ACK missed detection probability, which is defined as the probability of not detecting an ACK bit when an ACK bit was sent on the particular bit position, with each missed ACK bit being counted as one error. For an example, the ACK missed detection probability shall not exceed 1% at the SNR given in table 8.3.6.1-1 and table 8.3.6.1-2, for 4 and 16 AN bits per sub-frame, respectively in the 3GPP TS36.104.

TABLE 8.3.6.1-1

Minimum requirements for PUCCH format 3, 4AN bits

| Number of Tx antennas | Number of RX antennas | Cyclic Prefix | Propagation Conditions and correlation matrix (Annex B) | Channel Bandwidth/SNR [dB] | | | | | |
|---|---|---|---|---|---|---|---|---|---|
| | | | | 1.4 MHz | 3 MHz | 5 MHz | 10 MHz | 15 MHz | 20 MHz |
| 1 | 2 | Normal | EPA 5 Low | — | — | — | −3.7 | −3.8 | −3.8 |
| | | | EVA70 Low | — | — | — | −3.5 | −3.6 | −3.7 |
| | 4 | Normal | EPA 5 Low | — | — | — | −7.3 | −7.4 | −7.5 |
| | | | EVA70 Low | — | — | — | −7.2 | −7.3 | −7.3 |
| | 8 | Normal | EPA 5 Low | — | — | — | −11.1 | −10.9 | −11.1 |
| | | | EVA70 Low | — | — | — | −10.9 | −11.0 | −11.0 |

TABLE 8.3.6.1-2

Minimum requirements for PUCCH format 3, 16AN bits

| Number of Tx antennas | Number of RX antennas | Cyclic Prefix | Propagation Conditions and correlation matrix (Annex B) | Channel Bandwidth/SNR [dB] | | | | | |
|---|---|---|---|---|---|---|---|---|---|
| | | | | 1.4 MHz | 3 MHz | 5 MHz | 10 MHz | 15 MHz | 20 MHz |
| 1 | 2 | Normal | EPA 5 Low | — | — | — | −1.3 | −1.2 | −1.2 |
| | | | EVA70 Low | — | — | — | −0.8 | −0.9 | −0.9 |
| | 4 | Normal | EPA 5 Low | — | — | — | −5.3 | −5.3 | −5.4 |
| | | | EVA70 Low | — | — | — | −5.0 | −5.1 | −5.1 |
| | 8 | Normal | EPA 5 Low | — | — | — | −8.8 | −8.8 | −8.9 |
| | | | EVA70 Low | — | — | — | −8.7 | −8.8 | −8.7 |

Second performance requirement is the DTX to ACK probability, which is the probability that an ACK is detected when nothing was sent. This probability shall not exceed 1%, where the performance measure definition is as follows:

$$Prob(PUCCH\ DTX \rightarrow ACK\ bits) = \frac{\#(false\ ACK\ bits)}{\#(PUCCH\ DTX) \times \#(ACK/NAK\ bits)} \leq 10^{-2}$$

where:
1. #(false ACK bits) denotes the number of detected ACK bits.
2. #(ACK/NACK bits) denotes the number of encoded bits per sub-frame
3. #(PUCCH DTX) denotes the number of DTX occasions One technique for ACK/DTX detection involves a threshold-based detection mechanism. When nothing is transmitted, the detection mechanism decides that the UE is in DTX mode instead of an ACK transmission mode, when a selected metric is lower than a selected threshold. However, the two detection performance requirements are conflicting (e.g., a low miss detection probability without increasing false alarm probability).

In an embodiment, a bit-level decorrelation value for all the possible information bit streams is calculated. A search for the maximum correlation result is performed and the bit stream with the maximum correlation value is considered as the transmitted information bit stream. The next correlation result after the maximum is called the submax correlation value. The bit-domain max and submax correlation values are reported. A reliability metric (I_dtx) can be derived from these bit level correlation values, such as (Metric=max_Corr−submax_Corr). In another embodiment, the metric is based on the maxCorr value, and then this metric is compared with a given threshold. Thus, a decision can be made according to the following conditions;

```
If (I_dtx > Threshold)
    DTX = 0; means it is not DTX mode, and the detected ACK bit
    streams shall be considered
Else if (I_dtx <= Threshold) then
    DTX =1; which means there is no HARQ-ACK bits transmitted.
End
``` where I_dtx is the metric and can be considered as a general function of f(max_Corr, submax_Corr).

It can be seen that the threshold comparison plays a significant role in not only the accuracy of the DTX detection, but also the miss detection probability of the ACK bits. For example, if this threshold comparison leads to a DTX detection, this means that the detected bit packet will need to be dropped from counting toward the miss detection probability, and thus increases the miss detection probability. A more reliable DTX detection mechanism is desired.

Two Stage DTX Detection Mechanism

In various exemplary embodiments, a novel two-stage DTX detection mechanism is provided that can significantly increase the accuracy of the DTX detection performance and thus improve the miss detection probability under the false alarm probability requirements described above.

In an exemplary embodiment, DTX detection comprises an apparatus for generating metrics and a systematic method for calculating an optimal threshold for different scenarios based on, for example, the number of ACK bits, rank size, etc.

Figure 2:
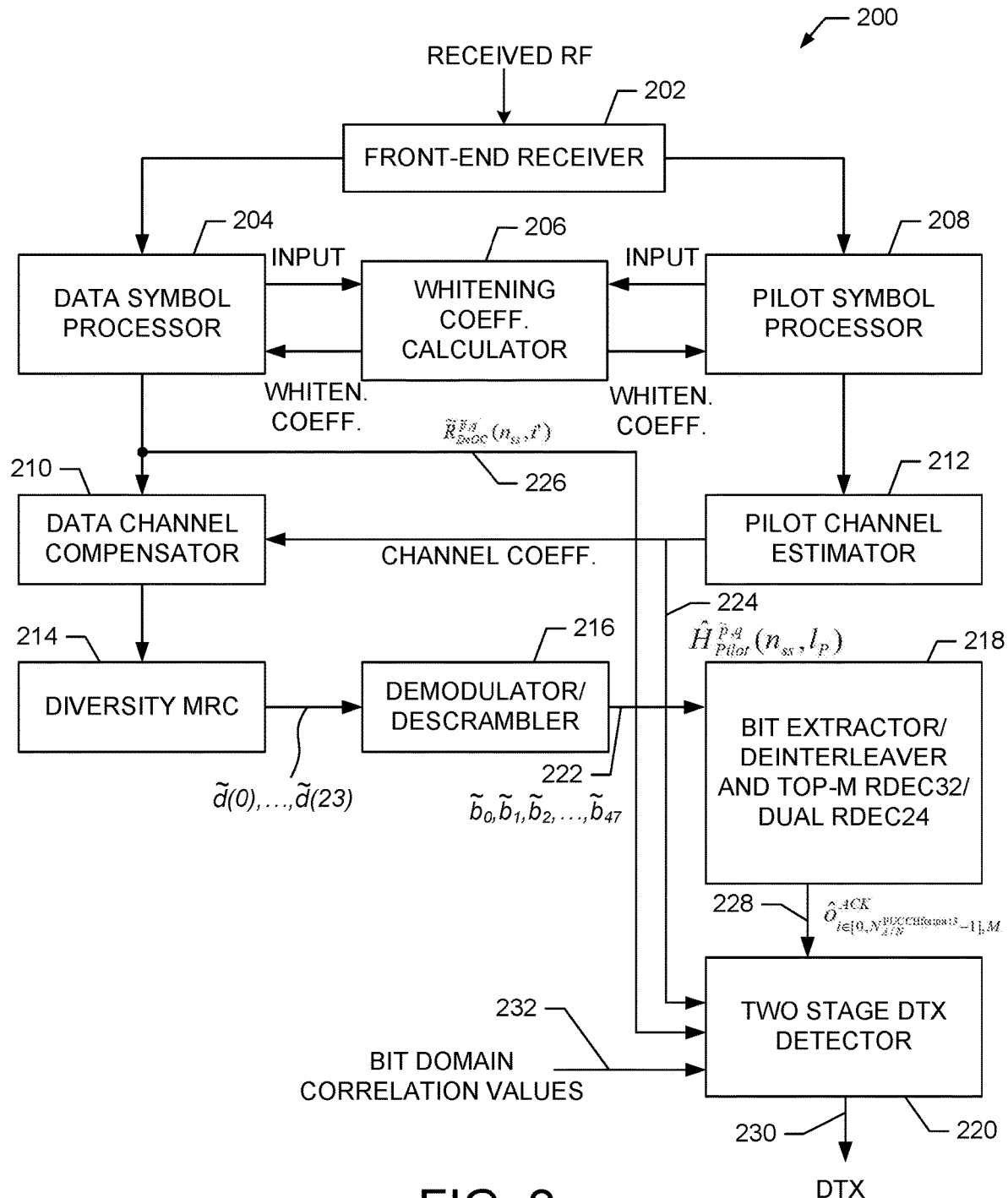
FIG. 2 shows an embodiment of a receiver that comprises an exemplary embodiment of a two-stage DTX detector.

FIG. 2 shows an embodiment of a receiver 200 that comprises an exemplary embodiment of a two-stage DTX detector 220. For example, the DTX detector 220 is suitable for use as the DTX detector 152 shown in FIG. 1.

The receiver 200 comprises front-end receiver 202 that receives uplink transmissions and performs front end fast Fourier transform (FFT) processing to extract data and pilot information. The data information is input to a data symbol processor 204 and the pilot information is input to a pilot symbol processor 208.

A whitening coefficient calculator 206 generates whitening coefficients for both the pilot symbol processor 208 and the data symbol processor 204. The pilot symbol processor 208 performs pilot AFC processing and whitening to generate processed pilot information that is input to a pilot channel estimator 212. The pilot channel estimator 212 generates channel estimates that are input to a data channel compensator 210. For example, in an exemplary embodiment, the pilot channel coefficients can be expressed as follows.

$$\hat{H}_{Pilot}^{p,q}(n_{SS}, l_P)$$

The data symbol processor 204 performs DFT, despreading, and channel whitening to generate processed data symbols that also are input to the data channel compensator 210. In an embodiment, the data symbol processor 204 outputs data symbol information 226 to the two stage DTX detector 220. For example, the data symbol information 226 can be expressed as follows.

$$\tilde{R}_{DeOC}^{p,q}(n_{SS}, i')$$

The data channel compensator 210 outputs compensated data to a diversity MRC block 214, which generates scrambled data (e.g., $\tilde{d}(0), \ldots, \tilde{d}(23)$) that is output to a demodulator/descrambler 216 that generates demodulated/descrambled data ($\tilde{b}_0, \tilde{b}_1, \tilde{b}_2, \ldots, \tilde{b}_{47}$) 222, which is input to bit extractor/deinterleaver 218.

The bit extractor/deinterleaver 218 performs Reed Muller 32-bit decoding (RDEC32) for NACK<=11 and dual Reed Muller 24-bit decoding (RDEC24) for 11<NACK<=22. In an embodiment, the bit extractor/deinterleaver 218 comprises a bit extractor and a Top-M list RM 32-bit decoder to generate candidate ACK bits ($\hat{O}_i^{ACK}$) 228 for NACK<=11. In addition, the bit extractor/deinterleaver 218 comprises a dual RM deinterleaver, dual Top-M list RDEC24 decoders and dual bit demappers to generate the candidate ACK bits ($\hat{O}_i^{ACK}$) 228 for 11<NACK<=22. A more detailed description of the bit extractor/deinterleaver 218 is provided below.

In an exemplary embodiment, the two-stage DTX detector 220 receives pilot channel coefficients 224 output from the pilot channel estimator 212 and data symbol information 226 output from the data symbol processor 204. The two-stage DTX detector 220 also receives the candidate ACK bits 228 and bit-domain correlation values 232 to generate a DTX detection result 230.

Figure 3:
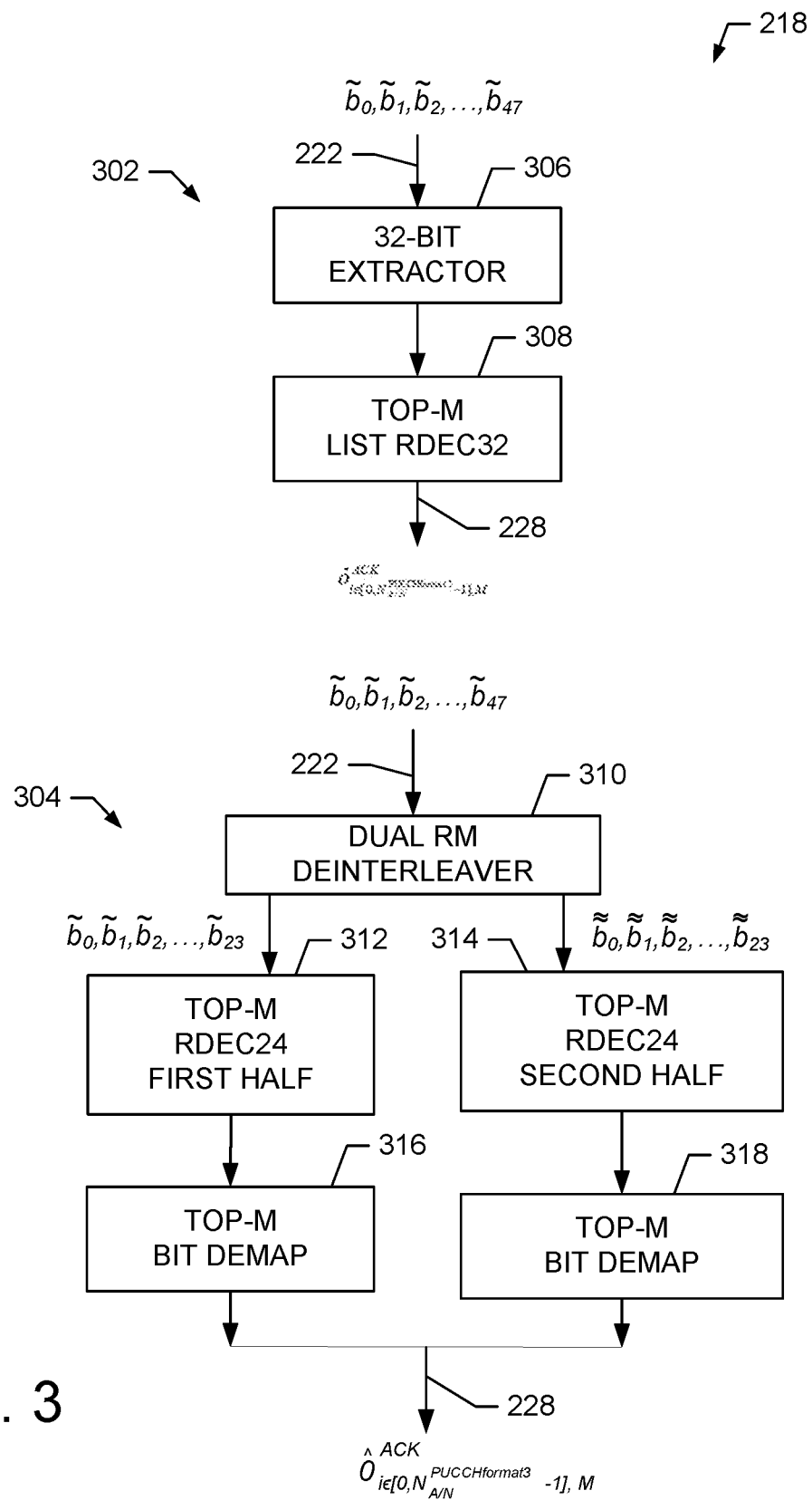
FIG. 3 shows an exemplary embodiments of the bit extraction/deinterleaver.

FIG. 3 shows an exemplary embodiments of the bit extraction/deinterleaver 218. The bit extractor/deinterleaver 218 comprises a first processing portion 302 and a second processing portion 304. The first processing portion 302 comprises a 32-bit extractor 306 and a Top-M list RDEC32 decoder 308. The second processing portion 304 comprises a dual RM deinterleaver 310, a first Top-M list RDEC24 decoder 312, a second Top-M list RDEC24 decoder 314, a first Top-M bit demapper 316 and a second Top-M bit demapper 318.

In an exemplary embodiment, the first processing portion 302 and the second processing portion 304 generate Top-M candidate ACK bits 228, which are the Top-M (e.g., M is an integer) most probable candidates for the decoded ACK bits. In an embodiment, the first processing portion 302 and the second processing portion 304 comprise modified Reed-Muller decoders that produce the decoded ACK bits based on one or more metrics in the bit domain. For example, the Top-M candidate ACK bits can be denoted as:

$$[b(0), b(1), \ldots, b(N-1)]\_[0, M-1] = \text{argmax Metric}(j);$$

where the M bit sequences are the M most likely candidates that produce the highest M metrics for a Maximum-likelihood search.

In an embodiment, two scenarios are handled by the bit extractor/deinterleaver 218 so that Top-M candidate ACK bits 228 are generated depending on the number of ACK bits. For example, for $N_{A/N}^{PUCCH\ format\ 3} \leq 11$, the first processing portion 302 operates to generate Top-M candidate ACK bits 228. For example, the 32-bit extractor 306 extracts soft bits from the received descrambled bits $[\tilde{b}_0, \tilde{b}_1, \tilde{b}_2, \ldots, \tilde{b}_{47}]$ 222. The 32 soft bits are passed to the Top-M list RDEC32 308 which generates the candidate ACK bits $[\hat{o}_i^{ACK}]$ 228.

For the case of $11 < N_{A/N}^{PUCCH\ format\ 3} \leq 22$, the received descrambled bits $[\tilde{b}_0, \tilde{b}_1, \tilde{b}_2, \ldots, \tilde{b}_{47}]$ 222 are deinterleaved by the dual RM deinterleaver 310 to generate two sets of deinterleaved bits that are input to dual Top-M list RDEC24 decoders (316. 318), respectively. Each decoder (316. 318) produces corresponding decoded bits. The decoded bits are demapped by Top-M bit demappers (316, 318) to generate the candidate ACK bits $[\hat{o}_i^{ACK}]$ 228.

Figure 4:
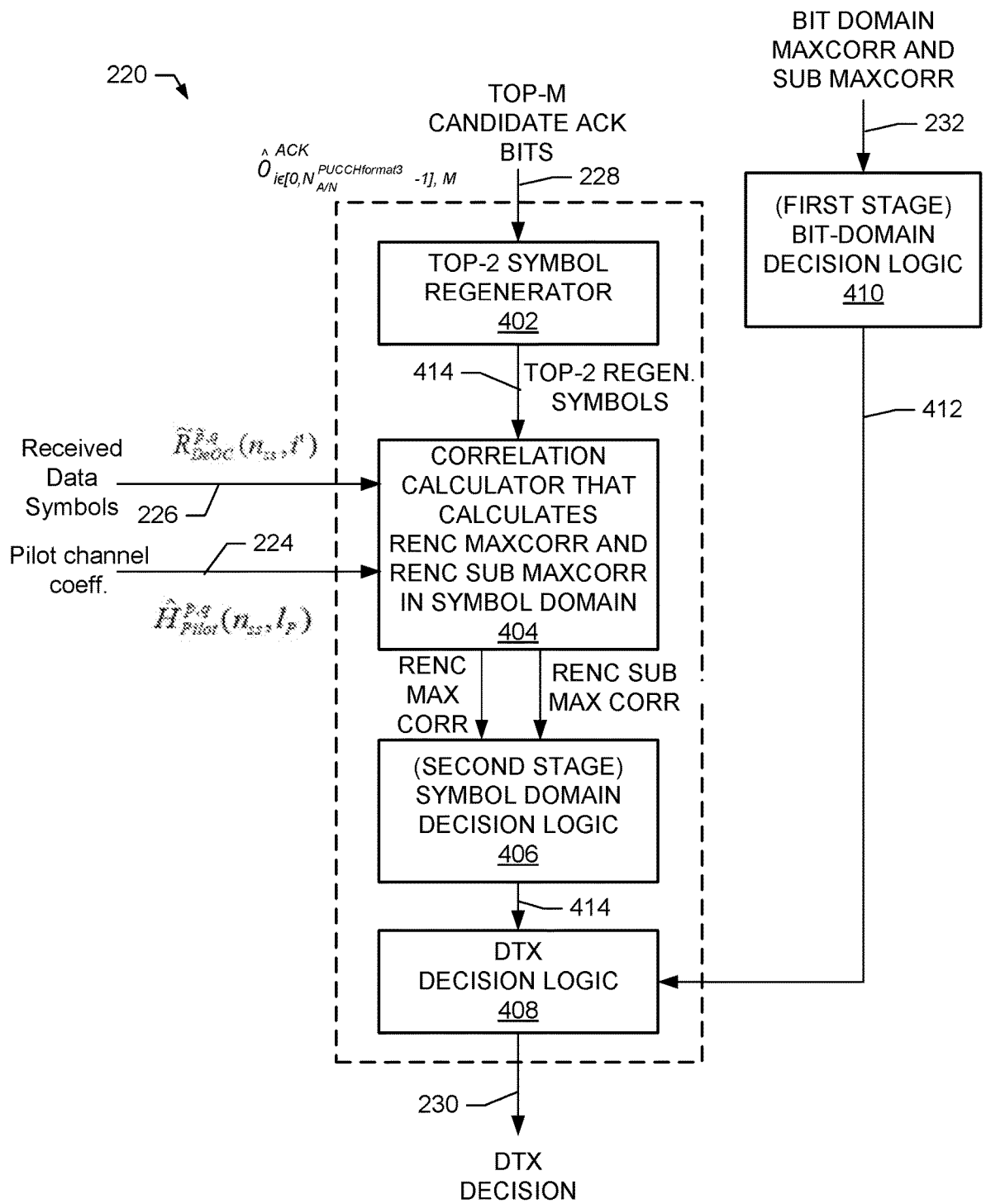
FIG. 4 shows an exemplary block diagram of the two stage DTX detector shown in FIG. 2.

FIG. 4 shows an exemplary block diagram of the two-stage DTX detector 220 shown in FIG. 2. In an embodiment, the detector 220 comprises a Top-2 symbol regenerator 402, correlation calculator 404, symbol domain decision logic 406, and DTX decision logic 408. Also shown in FIG. 4 is bit-domain decision logic 410 that receives bit-domain maximum correlation and sub maximum correlation values as described above and generates a bit-domain DTX decision 412 that is input to the DTX decision logic 408.

In an embodiment, the Top-2 symbol regenerator 402 receives the Top-M candidate ACK bits 228 and generates Top-2 candidate symbols 414 that are input to the correlation calculator 404. In an embodiment, the Top-2 candidate symbols are the regenerated symbols from each of the Top-M bit candidates.

The correlation calculator 404 receives data symbol information 226 and pilot channel coefficients 224 along with the Top-2 regenerated candidate symbols and generates one or both of a re-encoded maximum correlation value (renc maxCorr) and a re-encoded sub-maximum correlation value (renc sub maxCorr). These values are input to the symbol domain decision logic 406.

For example, the following equations can be used to generate a joint channel estimate for the regenerated data symbol candidates.

$$\tilde{H}_{Data\ regen}^{[0,M-1]}(n_{SS}, i') = \tilde{R}_{Data}^{\tilde{p},q}(n_{SS}, i') \tilde{d}^{[0,M-1]}(n_{SS} * N_{SC}^{RB} + i')$$

$$i' \in [0,11], n_{SS} \in [0,1]$$

For example, the following equations can be used for combining partial metric for the regenerated data symbols candidates and pilot symbols.

$$MetricEng_{[0:M-1]}^{\tilde{p},q} = \sum_{n_{SS}} \left\{ \sum_{i'} \left| \tilde{H}_{Data[0:M-1]}^{\tilde{p},q}(n_{SS}, i') \right|^2 + \sum_{I_P} \left| \tilde{H}_{Pilot}^{\tilde{p},q}(n_{SS}, I_P) \right|^2 \right\}$$

$$i' \in [0, 11], n_{SS} \in [0, 1]$$

For example, the following equations can be used to perform ML metric MRC metric combining for selected candidates, which determines the renc maxCorr and renc sub maxCorr values.

$$MetricEng_{[0:M-1]}^{MRC} = \sum_{\tilde{p}} \sum_{q} MetricEng_{[0:M-1]}^{\tilde{p},q}$$

The symbol domain decision logic 406 receives one or both of the renc maxCorr and renc sub maxCorr values and generates a symbol domain DTX decision 414 that is input the DTX decision logic 408.

The DTX decision logic 408 also receives the bit-domain DTX decision 412 and the symbol domain DTX decision 414 and generates a final DTX decision 230. For example, the DTX decision logic 408 uses majority logic to make the determination of the final DTX decision 230. A more detailed description of the operation of the DTX decision logic 408 is provided below.

Figure 5:
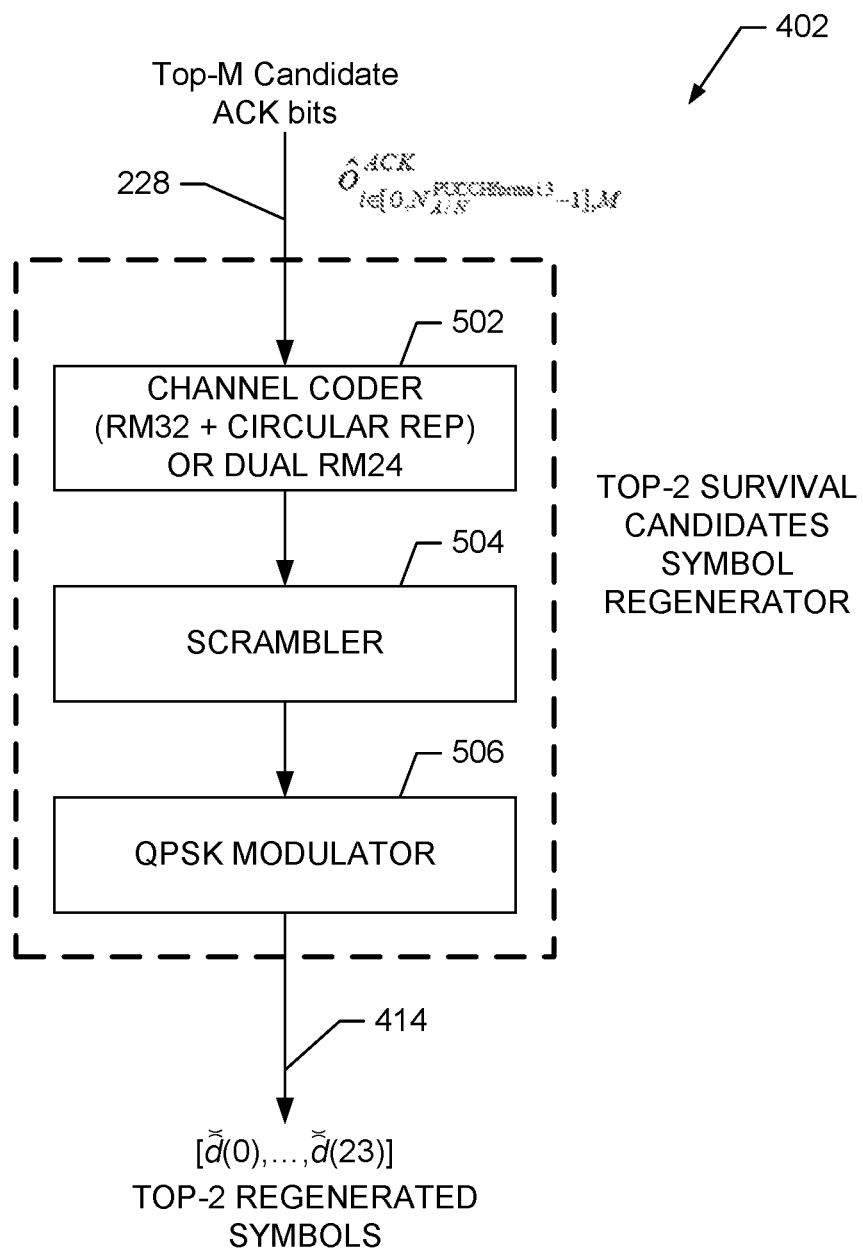
FIG. 5 shows a detailed exemplary embodiment of the Top-M survival candidate symbol regenerator shown in FIG. 4.

FIG. 5 shows a detailed exemplary embodiment of the Top-2 survival candidate symbol regenerator 402 shown in FIG. 4. In an embodiment, the regenerator 402 comprises channel coder 502, scrambler 504, and QPSK modulator 506.

In an embodiment, the channel coder 502 receives the Top-M survival candidates ACKS 228 and performs channel coding using a RM32 or dual RM24 coders. For example, the channel coder 502 generate coded Top-M survival candidates and inputs these into the scrambler 504.

In an embodiment, the scrambler 504 scrambles the coded Top-M survival candidates and performs a scrambling process to generate scrambled Top-2 candidates that are input to the QPSK modulator 506.

In an embodiment, the QPSK modulator 506 modulates the scrambled Top-2 candidates to generate the Top-2 regenerated symbols 414. As illustrated in FIG. 4, these regenerated symbols are input to the correlation calculator 404.

Figure 6:
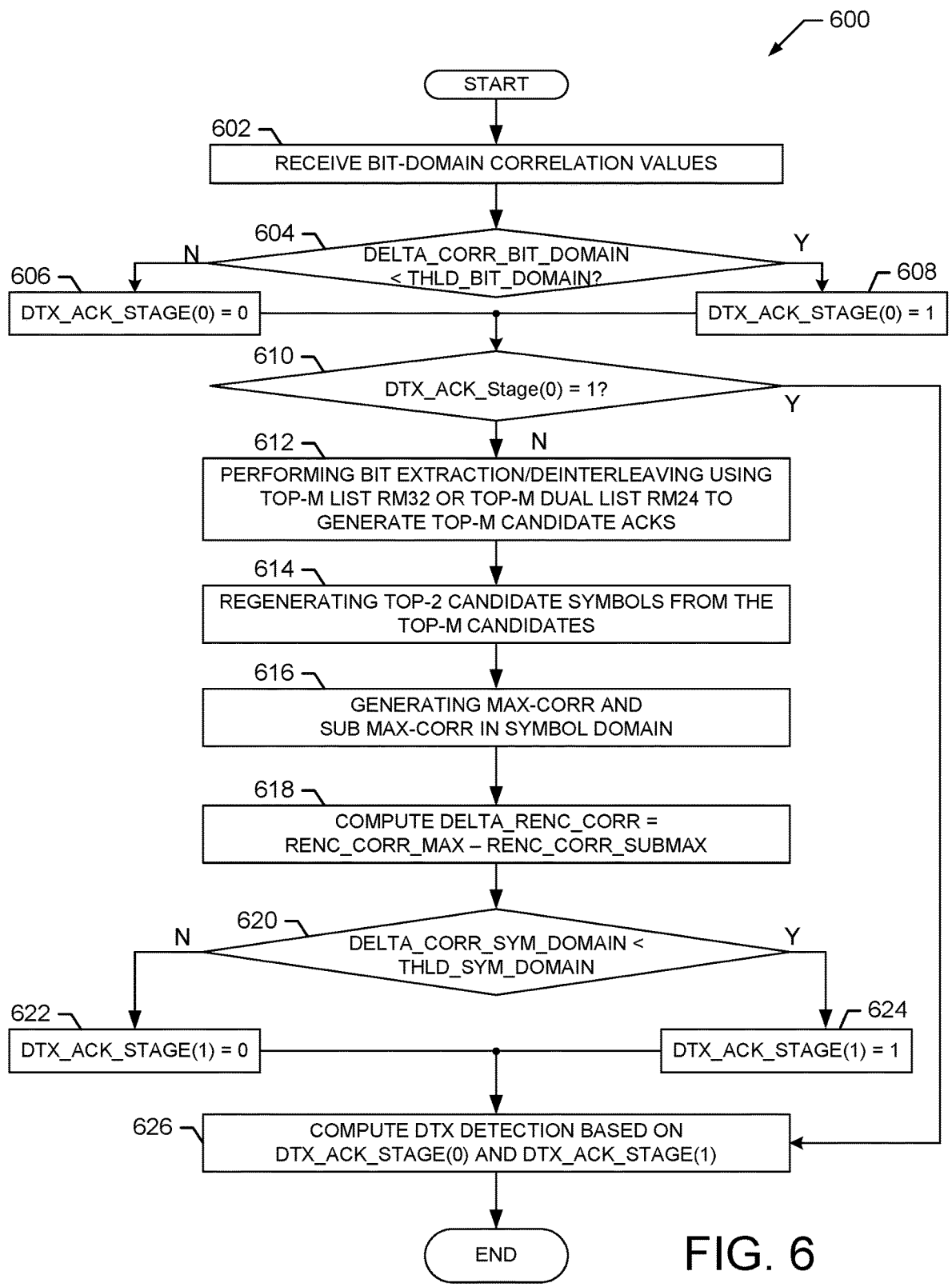
FIG. 6 shows an exemplary method for operating a two-stage DTX detector that uses majority logic.

FIG. 6 shows an exemplary method 600 for operating a two-stage DTX detector that uses majority logic. For example, the method 600 is suitable for use with the two-stage DTX detector 220 illustrated in FIG. 2 and FIG. 4.

At block 602, bit-domain correlation values are received. For example, in an embodiment, the bit-domain correlation values (maxcorr and sub maxcorr) are received by the first stage decision logic 410.

At block 604, a determination is made as to whether a delta (or difference) between the received bit-domain values is less than a threshold value. For example, a metric is defined as (delta_corr_bit-domain=maxCorr−sub maxCorr). If the metric is not less than the threshold value, the method proceeds to block 606. If the metric is less than the threshold value, the method proceeds to block 608. For example, the decision logic 410 makes this determination.

At block 606, since the metric of the received bit-domain values is not less than a threshold value, a first stage parameter is set to zero. For example, the first stage parameter DTX_ACK_STAGE(0) is set to zero. For example, the decision logic 410 sets the first stage parameter value to zero.

At block 608, since the metric of the received bit-domain values is less than a threshold value, a parameter is set to one. For example, the parameter DTX_ACK_STAGE(0) is set to one. For example, the decision logic 410 sets the first stage parameter value to one.

At block 610, a determination is made as to whether the first stage parameter is set to zero or one. If set to zero, the method proceeds to block 612. If set to one, the method proceeds to block 626. For example, the decision logic 410 makes this determination.

At block 612, bit extraction/deinterleaving is performed along with RM32 or dual RM24 decoding to generate Top-M candidate ACKS. For example, the bit extractor/deinterleaver 218 performs this operation.

At block 614, Top-2 candidate symbols are generated from the Top-M candidate ACKS. For example, the Top-2 symbol regenerator 402 performs this operation.

At block 616, one or both of renc maxCorr and renc sub maxCorr values are generated in the symbol domain. For example, the correlation calculator 404 performs this operation.

At block 618, a delta RENC_corr value is computed. For example, the decision logic 406 performs this operation.

At block 620, a determination is made as to whether the delta RENC_corr value is less than a threshold value. If so, the method proceeds to block 624. If not, the method proceeds to block 622. For example, the decision logic 406 performs this operation.

At block 622, since the delta RENC_corr value is not less than a threshold value, a second stage parameter is set to zero. For example, the second stage parameter DTX_ACK_STAGE(1) is set to zero. For example, the decision logic 406 performs this operation.

At block 624, since the delta RENC_corr value is less than a threshold value, the second stage parameter is set to one. For example, the second stage parameter DTX_ACK_STAGE(1) is set to one. For example, the decision logic 406 performs this operation.

At block 626, a DTX detection result is determined from the DTX_ACK_STAGE(0) and DTX_ACK_STAGE(1) values. For example, the DTX decision logic 408 performs this operation. For example, in one embodiment, a decision is based on majority logic. For example, if the first stage value is a 1 (DTX detection), then the second stage criteria are checked. If the second stage value is also a one (DTX detection), then the DTX detection is kept as the final result. Otherwise the first stage decision is reversed.

Thus, the method 600 operates a two-stage DTX detector using majority logic to make a DTX determination. In one aspect, results show that with the 2-stage symbol domain metric and majority logic decision, the miss detection probability performance is significantly increased while meeting the requirement of the false alarm detection (DTX−>ACK) probability.

Figure 7:
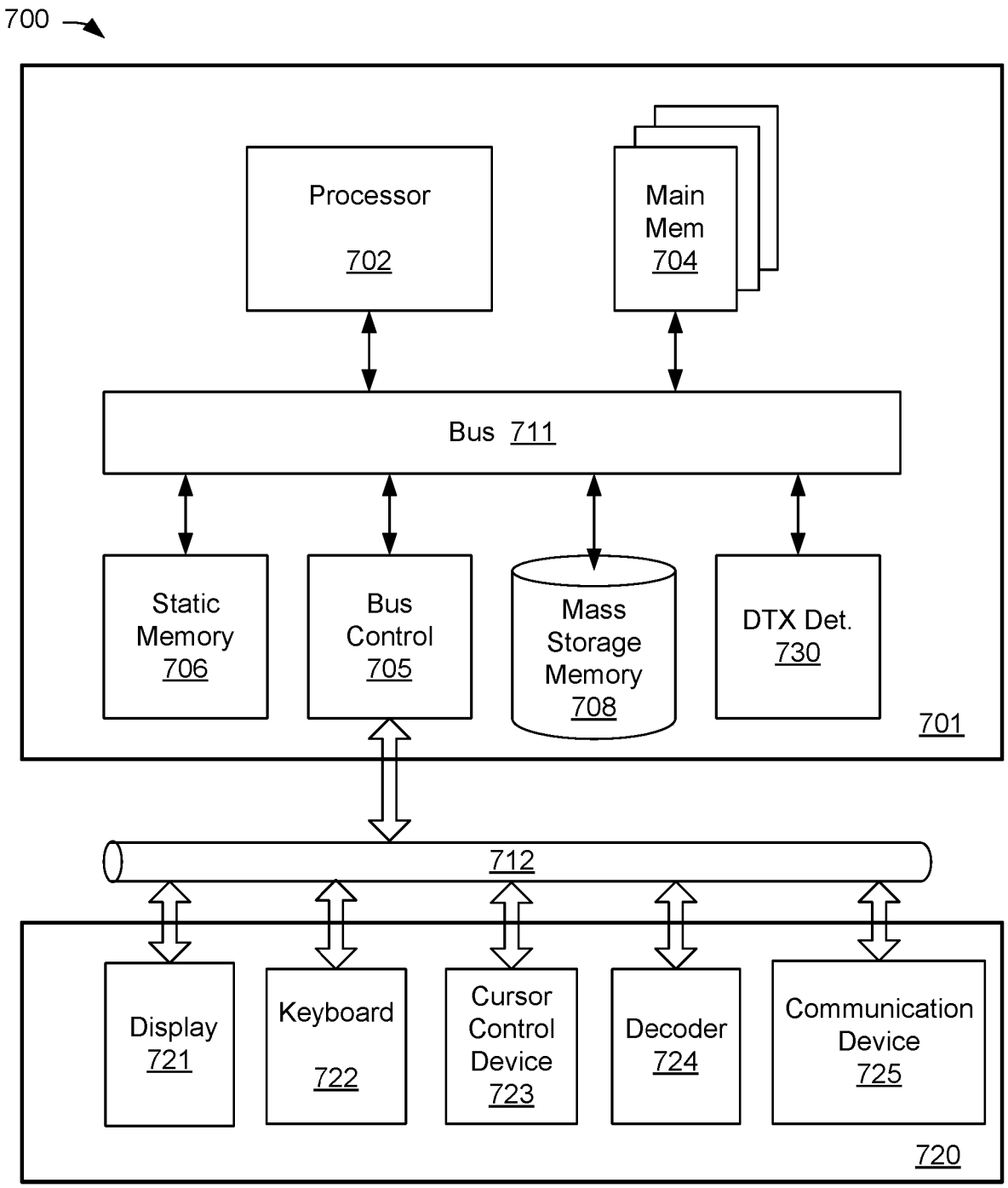
FIG. 7 illustrates an exemplary digital computing system with various networking features.

FIG. 7 illustrates an exemplary digital computing system 700 with various networking features. It will be apparent to those of ordinary skill in the art that other alternative computer system architectures may also be employed.

Computer system 700 includes a processing unit 701, an interface bus 712, and an input/output ("IO") unit 720. Processing unit 701 includes a processor 702, main memory 704, system bus 711, static memory device 706, bus control unit 705, and mass storage memory 707. Bus 711 is used to transmit information between various components and processor 702 for data processing. Processor 702 may be any of a wide variety of general-purpose processors, embedded processors, or microprocessors such as ARM® embedded processors, Intel® Core™2 Duo, Core™2 Quad, Xeon®, Pentium™ microprocessor, AMD® family processors, MIPS® embedded processors, or Power PC™ microprocessor.

Main memory 704, which may include multiple levels of cache memories, stores frequently used data and instructions. Main memory 704 may be RAM (random access memory), MRAM (magnetic RAM), or flash memory. Static memory 706 may be a ROM (read-only memory), which is coupled to bus 711, for storing static information and/or instructions. Bus control unit 705 is coupled to buses 711-712 and controls which component, such as main memory 704 or processor 702, can use the bus. Mass storage memory 708 may be a magnetic disk, solid-state drive ("SSD"), optical disk, hard disk drive, floppy disk, CD-ROM, and/or flash memories for storing large amounts of data.

I/O unit 720, in one example, includes a display 721, keyboard 722, cursor control device 723, web browser 724, and communication device 725. Display device 721 may be a liquid crystal device, flat panel monitor, cathode ray tube ("CRT"), touch-screen display, or other suitable display device. Display 721 projects or displays graphical images or windows. Keyboard 722 can be a conventional alphanumeric input device for communicating information between computer system 700 and computer operator(s). Another type of user input device is cursor control device 723, such as a mouse, touch mouse, trackball, or other type of cursor for communicating information between system 700 and user(s).

Communication device 725 is coupled to bus 712 for accessing information from remote computers or servers through wide-area network. Communication device 725 may include a modem, a router, or a network interface device, or other similar devices that facilitate communication between computer 700 and the network. In one aspect, communication device 725 is configured to perform wireless functions.

In one embodiment, DTX detector 730 is coupled to bus 711 and is configured to provide DTX detection. The DTX detector 730 comprises hardware, firmware, or a combination of hardware and firmware to perform all the DTX detection functions described herein.

While particular embodiments of the present invention have been shown and described, it will be obvious to those skilled in the art that, based upon the teachings herein, changes and modifications may be made without departing from these exemplary embodiments of the present invention and their broader aspects. Therefore, the appended claims are intended to encompass within their scope all such changes and modifications as are within the true spirit and scope of the exemplary embodiments of the present invention.

What is claimed is:

1. A method, comprising:
   determining a first stage DTX value from bit-domain correlation values;
   determining a second stage DTX value from symbol domain correlation values; and
   determining a DTX decision based on the first stage DTX value and the second stage DTX value.

2. The method of claim 1, further comprising computing a bit-domain maximum correlation value and a sub maximum correlation value as the bit-domain correlation values.

3. The method of claim 2, further comprising:
setting the first stage DTX value to a first state when a difference between the bit-domain maximum correlation value and the sub maximum correlation value is less than a threshold; and
setting the first stage DTX value to a second state when the difference between the bit-domain maximum correlation value and the sub maximum correlation value is not less than a threshold.

4. The method of claim 1, further comprising generating Top-M candidate ACKS from descrambled symbols.

5. The method of claim 4, further comprising re-generating Top-2 candidate symbols from the Top-M candidate ACKS.

6. The method of claim 5, calculating a re-generating maximum correlation value and a re-generated sub maximum correlation value from the Top-2 candidate symbols.

7. The method of claim 6, computing a difference between the re-generated maximum correlation value and the re-generated sub maximum correlation value.

8. The method of claim 7, further comprising:
setting the second stage DTX value to a first state when the difference between the re-generated maximum correlation value and the re-generated sub maximum correlation value is less than a threshold; and
setting the second stage DTX value to a second state when the difference between the re-generated maximum correlation value and the re-generated sub maximum correlation value is not less than a threshold.

9. The method of claim 8, further comprising determining the DTX decision based on the first stage DTX value and the second stage DTX value using majority logic.

10. The method of claim 9, wherein a DTX transmission is determined when both of the first stage DTX value and the second stage DTX value indicate the DTX transmission.

11. An apparatus, comprising:
bit-domain decision logic that determines a first stage DTX value from bit-domain correlation values;
symbol domain decision logic that determines a second stage DTX value from symbol domain correlation values; and
DTX decision logic that determines a DTX decision based on the first stage DTX value and the second stage DTX value.

12. The apparatus of claim 11, wherein the bit-domain decision logic computes a bit-domain maximum correlation value and a sub maximum correlation value as the bit-domain correlation values.

13. The apparatus of claim 12, wherein the bit-domain decision logic sets the first stage DTX value to a first state when a difference between the bit-domain maximum correlation value and the sub maximum correlation value is less than a threshold, and sets the first stage DTX value to a second state when the difference between the bit-domain maximum correlation value and the sub maximum correlation value is not less than a threshold.

14. The apparatus of claim 11, further comprising a bit extractor/deinterleaver that generates Top-M candidate ACKS from descrambled symbols.

15. The apparatus of claim 14, further comprising a symbol regenerator that re-generates Top-2 candidate symbols from the Top-M candidate ACKS.

16. The apparatus of claim 15, further comprising a correlation calculator that calculates a re-generating maximum correlation value and a re-generated sub maximum correlation value in symbol domain.

17. The apparatus of claim 16, wherein the symbol domain decision logic computes a difference between the re-generated maximum correlation value and the re-generated sub maximum correlation value.

18. The apparatus of claim 17, wherein the symbol domain decision logic sets the second stage DTX value to a first state when the difference between the re-generated maximum correlation value and the re-generated sub maximum correlation value is less than a threshold, and sets the second stage DTX value to a second stats when the difference between the re-generated maximum correlation value and the re-generated sub maximum correlation value is not less than a threshold.

19. The apparatus of claim 18, wherein the DTX decision logic determines the DTX decision based on the first stage DTX value and the second stage DTX value using majority logic.

20. The apparatus of claim 19, wherein the DTX decision logic determines that a DTX transmission is received when both of the first stage DTX value and the second stage DTX value indicate the DTX transmission.

* * * * *